United States Patent
Di et al.

(10) Patent No.: US 7,977,972 B2
(45) Date of Patent: Jul. 12, 2011

(54) ULTRA-LOW POWER MULTI-THRESHOLD ASYNCHRONOUS CIRCUIT DESIGN

(75) Inventors: Jia Di, Fayetteville, AR (US); Scott Christopher Smith, Rogers, AR (US)

(73) Assignee: The Board of Trustees of the University of Arkansas, Little Rock, AR (US)

( * ) Notice: Subject to any disclaimer, the term of this patent is extended or adjusted under 35 U.S.C. 154(b) by 0 days.

(21) Appl. No.: 12/771,886

(22) Filed: Apr. 30, 2010

(65) Prior Publication Data

US 2011/0032000 A1 Feb. 10, 2011

Related U.S. Application Data

(60) Provisional application No. 61/232,181, filed on Aug. 7, 2009.

(51) Int. Cl.
H03K 19/173 (2006.01)
(52) U.S. Cl. .................. 326/46; 326/93; 326/21
(58) Field of Classification Search .............. 326/37, 326/38, 46, 93–98, 21, 26, 27
See application file for complete search history.

(56) References Cited

U.S. PATENT DOCUMENTS

| | | | |
|---|---|---|---|
| 5,305,463 A | 4/1994 | Fant et al. | |
| 5,434,520 A * | 7/1995 | Yetter et al. | 326/93 |
| 5,652,902 A | 7/1997 | Fant | |
| 5,656,948 A | 8/1997 | Sobelman et al. | |
| 5,664,211 A | 9/1997 | Sobelman et al. | |
| 5,664,212 A | 9/1997 | Fant et al. | |
| 5,828,228 A | 10/1998 | Fant et al. | |
| 6,031,390 A | 2/2000 | Fant et al. | |
| 6,043,674 A | 3/2000 | Sobelman | |
| 6,052,770 A | 4/2000 | Fant | |
| 6,140,836 A | 10/2000 | Fujii et al. | |
| 6,208,171 B1 | 3/2001 | Kumagai et al. | |
| 6,225,827 B1 | 5/2001 | Fujii et al. | |
| 6,262,593 B1 | 7/2001 | Sobelman et al. | |
| 6,320,418 B1 * | 11/2001 | Fujii et al. | 326/93 |
| 6,333,640 B1 | 12/2001 | Fant et al. | |
| 6,867,620 B2 | 3/2005 | Singh et al. | |
| 6,900,658 B1 | 5/2005 | Sobelman et al. | |
| 6,907,534 B2 * | 6/2005 | Ku | 713/320 |
| 6,946,869 B2 | 9/2005 | Jacobson et al. | |
| 7,051,306 B2 | 5/2006 | Hoberman et al. | |
| 7,053,665 B2 * | 5/2006 | Singh et al. | 326/121 |
| 7,215,155 B2 | 5/2007 | Won | |
| 7,400,175 B2 | 7/2008 | Fallah et al. | |
| 7,415,680 B2 | 8/2008 | Hoberman et al. | |

(Continued)

OTHER PUBLICATIONS

Al Zahrani, A. et al., "Glitch-free design for multi-threshold CMOS NCL circuits," 2009 Great Lakes Symposium on VLSI (May 2009) 215-220.

(Continued)

*Primary Examiner* — Don P Le
(74) *Attorney, Agent, or Firm* — Michael Best & Friedrich LLP

(57) ABSTRACT

A Multi-Threshold CMOS NULL Convention Logic asynchronous circuit (MTNCL). The MTNCL circuit provides delay-insensitive logic operation with significant leakage power and active energy reduction. The MTNCL circuit is also capable of functioning properly under extreme supply voltage scaling down to the sub-threshold region for further power reduction. Four MTNCL architectures and four MTNCL threshold gate designs offer an asynchronous logic design methodology for glitch-free, ultra-low power, and faster circuits without area overhead.

20 Claims, 12 Drawing Sheets

U.S. PATENT DOCUMENTS

| | | | |
|---|---|---|---|
| 7,511,535 | B2 | 3/2009 | Chakraborty et al. |
| 7,821,293 | B2 | 10/2010 | Fazzi et al. |
| 2005/0248365 | A1* | 11/2005 | Chang .......................... 326/39 |
| 2008/0133954 | A1* | 6/2008 | Fallah et al. ................. 713/323 |
| 2008/0276105 | A1 | 11/2008 | Hoberman et al. |
| 2009/0152948 | A1 | 6/2009 | Hoberman et al. |

OTHER PUBLICATIONS

Bailey, A.D. et al., "Multi-threshold asynchronous circuit design for ultra-low power," J. Low Power Electronics (2008) 4(3):337-348.

Bailey, A.D. et al., "Ultra-low power delay-insensitive circuit design," IEEE Midwest Symposium on Circuits and Systems (Aug. 20, 2008) 503-506.

Fant, K.M. et al., "NULL convention logic: A complete and consistent logic for asynchronous digital circuit synthesis," International Conference on Application Specific Systems, Architectures and Processors (1996) 261-273.

Kao, J.T. et al., "Dual-threshold voltage techniques for low-power digital circuits," IEEE J. Solid-State Circuits (2000) 35(7):1009-1018.

Lakshmikanthan, P. et al., "Design of ultra-low power combinational standard library cells using a novel leakage reduction methodology," IEEE International SOC Conference (2006) 2 pages.

Mutoh, J. et al., "1-V power supply high-speed digital circuit technology with multithreshold-voltage CMOS," IEEE J. Solid-State Circuits (1995) 30(8):847-854.

Smith, S.C. et al., "Delay-insensitive gate-level pipelining," Integration, the VLSI Journal (2001) 30(2):103-131.

Smith, S.C., "Speedup of self-timed ditigal systems using early completion," IEEE Computer Society Annual Symposium on VLSI (Apr. 2002) 107-113.

Sobelman, G.E. et al., "CMOS circuit design of threshold gales with hystereis," IEEE International Symposium on Circuits and Systems (II) (1998) 61-65.

Smith, S.C. et al., "Optimization of NULL convention self-timed circuits," The VLSI Journal (2004) 37(3):135-165.

Smith, S.C. et al., Designing Asynchronous Circuits Using NULL Convention Logic (NCL), Synthesis Lectures on Digital Circuits and Systems, Morgan & Claypool Publishers (Jul. 2009) vol. 4/1.

* cited by examiner a) static implementation    b) semi-static implementation (a)    (b)

ULTRA-LOW POWER MULTI-THRESHOLD ASYNCHRONOUS CIRCUIT DESIGN

RELATED APPLICATION

The present patent application claims the benefit of prior filed U.S. Provisional Patent Application No. 61/232,181, filed on Aug. 7, 2009, the entire content of which is hereby incorporated by reference.

STATEMENT REGARDING FEDERALLY SPONSORED RESEARCH OR DEVELOPMENT

This invention was made with government support under W15P7T-08-C-V404 awarded by the DARPA Microsystems Technology Office. The government has certain rights in the invention.

BACKGROUND

With the current trend of semiconductor devices scaling into the deep submicron region, design challenges that were previously minor issues have now become increasingly important. Where in the past, dynamic, switching power has been the predominant factor in CMOS digital circuit power dissipation, recently, with the dramatic decrease of supply and threshold voltages, a significant growth in leakage power demands new design methodologies for digital integrated circuits (ICs). The main component of leakage power is sub-threshold leakage, caused by current flowing through a transistor even if it is supposedly turned off. Sub-threshold leakage increases exponentially with decreasing transistor feature size.

Among the many techniques proposed to control or minimize leakage power in deep submicron technology, Multi-Threshold CMOS (MTCMOS), which reduces leakage power by disconnecting the power supply from the circuit during idle (or sleep) mode while maintaining high performance in active mode, is very promising. MTCMOS incorporates transistors with two or more different threshold voltages (Vt) in a circuit. Low-Vt transistors offer fast speed but have high leakage, whereas high-Vt transistors have reduced speed but far less leakage current. MTCMOS combines these two types of transistors by utilizing low-Vt transistors for circuit switching to preserve performance and high-Vt transistors to gate the circuit power supply to significantly decrease sub-threshold leakage.

There are multiple ways to implement MTCMOS in synchronous circuits. One method is to use low-Vt transistors for critical paths to maintain high performance, while using slower high-Vt transistors for the non-critical paths to reduce leakage. Besides this path replacement methodology, there are two other architectures for implementing MTCMOS. A coarse-grained technique uses low-Vt logic for all circuit functions and gates the power to entire logic blocks with high-Vt sleep transistors, as shown in FIG. 1. The sleep transistors are controlled by a Sleep signal. During active mode, the Sleep signal is deasserted, causing both high-Vt transistors to turn on and provide a virtual power and ground to the low-Vt logic. When the circuit is idle, the Sleep signal is asserted, forcing both high-Vt transistors to turn off and disconnect power from the low-Vt logic, resulting in a very low sub-threshold leakage current. One major drawback of this method is that partitioning the circuit into appropriate logic blocks and sleep transistor sizing is difficult for large circuits. An alternative fine-grained architecture, shown in FIG. 2, incorporates the MTCMOS technique within every gate, using low-Vt transistors for the Pull-Up Network (PUN) and Pull-Down Network (PDN) and a high-Vt transistor to gate the leakage current between the two networks. Two additional low-Vt transistors are included in parallel with the PUN and PDN to maintain nearly equivalent voltage potential across these networks during sleep mode. Implementing MTCMOS within each gate solves the problems of logic block partitioning and sleep transistor sizing; however, this results in a large area overhead.

In general, three serious drawbacks hinder the widespread usage of MTCMOS in synchronous circuits: 1) the generation of Sleep signals is timing critical, often requiring complex logic circuits; 2) synchronous storage elements lose data when the power transistors are turned off during sleep mode; and 3) logic block partitioning and transistor sizing is very difficult for the coarse-grained approach, which is critical for correct circuit operation, and the fine-grained approach requires a large area overhead.

SUMMARY

The invention pertains to the fields of Computer Engineering and Electrical Engineering. The invention combines Multi-Threshold CMOS (MTCMOS) for synchronous circuits and asynchronous, delay-insensitive NULL Convention Logic (NCL), to yield an ultra-low power asynchronous circuit design methodology, named Multi-Threshold NULL Convention Logic (MTNCL).

In one embodiment, the invention provides a delay-insensitive fixed early-completion input-incomplete architecture (FECII). The FECII architecture includes MTNCL combinational logic blocks, which are built using MTNCL logic gates. These gates have a plurality of low-Vt transistors having high speed and high leakage current, and a plurality of high-Vt transistors having lower speed and low leakage current. The high-Vt transistors gate power to the low-Vt transistors when the MTNCL circuit is in a sleep mode. The low-Vt transistors are used for switching the output in active mode. Due to the removal of hysteresis, most MTNCL gates have fewer transistors compared to their regular NCL counterparts, thereby eliminating the area overhead. The FECII architecture further includes a plurality of delay-insensitive early-completion registers, each register coupled to a respective MTNCL logic block to form a pipeline stage. The completion detection signal, Ko, of each pipeline stage, and the handshaking signal from the next stage, generate the handshaking signal for the current stage, which is used as both the inversed Ki signal to the register of the current stage and the Sleep control signal of the next stage.

In another embodiment the invention provides an early-completion input-incomplete MTNCL architecture (ECII). While similar to those used in FECII architecture, the MTNCL logic gates used in ECII architecture include hold1 structures, in order to avoid partial NULL from passing through since it may cause the loss of delay-insensitivity in ECII architecture.

MTNCL eliminates the three drawbacks of using the low-power MTCMOS technique with synchronous circuits (i.e., 1) the generation of Sleep signals is timing critical, often requiring complex logic circuits; 2) synchronous storage elements lose data when the power transistors are turned off during sleep mode; and 3) logic block partitioning and transistor sizing is very difficult for the coarse-grained approach, which is critical for correct circuit operation, and the fine-grained approach requires a large area overhead), to yield an ultra-low power asynchronous circuit design methodology. MTNCL circuits have been demonstrated to dissipate 99% less static power compared to regular NCL circuits, and 38% less static power compared to MTCMOS synchronous circuits; MTNCL circuits have been demonstrated to utilize 62% less energy per operation compared to regular NCL circuits, and 99% less energy per operation compared to MTCMOS synchronous circuits; and MTNCL circuits are slightly faster than their regular NCL counterparts, and have comparable speed to synchronous circuits. Additionally, since MTNCL circuits are delay-insensitive, the supply voltage can be dropped to even sub-threshold levels to substantially further decrease power usage, at the cost of decreased performance, without requiring any circuit modifications. MTNCL circuits designed with the 1.2V IBM 8RF 130 nm process have been demonstrated to work correctly down to a sub-threshold supply voltage of about 0.1V, and an energy-optimal supply voltage of about 0.3V, where energy per operation is reduced by a factor of about 400× and static power is reduced by a factor of about 15×.

In another embodiment, the invention provides an early completion input incomplete asynchronous circuit (ECII). The ECII includes a delay insensitive register, a multi-threshold null convention logic circuit, and an early completion circuit. The delay insensitive register has a data input, a data output, a request input, and an acknowledge output. The multi-threshold null convention logic circuit has a data input coupled to the delay insensitive register data output, a sleep input, and an output coupled to a data input of a delay insensitive register of a subsequent ECII. The early completion circuit has a first input coupled to the acknowledge output, a second input coupled to the request input, and an output coupled to the sleep input and to a request input of a delay insensitive register of a previous ECII.

In another embodiment, the invention provides a fixed early completion input incomplete asynchronous circuit (FECII). The FECII includes a delay insensitive register, a multi-threshold null convention logic circuit, an early completion circuit, and an inverter. The delay insensitive register has a data input, a data output, a request input, and an acknowledge output. The multi-threshold null convention logic circuit has a data input coupled to the delay insensitive register data output, a sleep input, and an output coupled to a data input of a delay insensitive register of a subsequent FECII. The early completion circuit has a first input coupled to the acknowledge output, a second input coupled to an output of an early completion circuit of a subsequent FECII, and an output coupled to the sleep input and to an input of an early completion circuit of a previous FECII. The inverter is coupled to the output of the early completion circuit and has an output coupled to the request input.

In another embodiment, the invention provides a early completion input incomplete asynchronous circuit (ECII). The circuit includes a delay insensitive register, a multi-threshold null convention logic circuit, and a slept early completion circuit. The delay insensitive register has a data input and a data output. The multi-threshold null convention logic circuit has a data input coupled to the delay insensitive register data output, a sleep input, and a data output. The slept early completion circuit has a first input coupled to an output of an early completion circuit of a subsequent ECII, a second input coupled to the output of an early completion circuit of a previous ECII, a third input coupled to the delay insensitive register data input, and an output coupled to the sleep input.

In another embodiment, the invention provides a multi-threshold null convention logic circuit. The circuit includes a first circuit coupled to $V_{cc}$, a set circuit coupled to the first circuit, a first high-threshold transistor coupled between the set circuit and ground, a second high-threshold transistor coupled to $V_{cc}$, a first low-threshold transistor coupled to the second high-threshold transistor, a third high-threshold transistor coupled between the first low-threshold transistor and ground, a second low-threshold transistor coupled between the coupling of the third high-threshold transistor and the first low-threshold transistor and ground, and an output coupled to the coupling between the third high-threshold transistor, the first low-threshold transistor, and the second low-threshold transistor. The first high-threshold transistor is driven by a SLEEP signal. The second high-threshold transistor is driven by a SLEEP signal. The first low-threshold transistor is driven by the coupling between the first circuit and the set circuit. The third high-threshold transistor is driven by the coupling between the first circuit and the set circuit. The second low-threshold transistor is driven by the SLEEP signal.

Other aspects of the invention will become apparent by consideration of the detailed description and accompanying drawings.

BRIEF DESCRIPTION OF THE DRAWINGS

FIG. 8a is schematic diagram of an original static MTCMOS NCL threshold gate structure.

FIG. 8b is a graph showing an output glitch produced by the gate structure of FIG. 8a.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

The three drawbacks of MTCMOS are eliminated by utilizing NULL Convention Logic (NCL) in conjunction with the MTCMOS technique, as described in embodiments of this invention, yielding an ultra-low power asynchronous circuit design methodology, referred to as Multi-Threshold NULL Convention Logic (MTNCL).

Early-Completion Input-Incomplete (ECII) MTNCL Architecture

Figure 1:
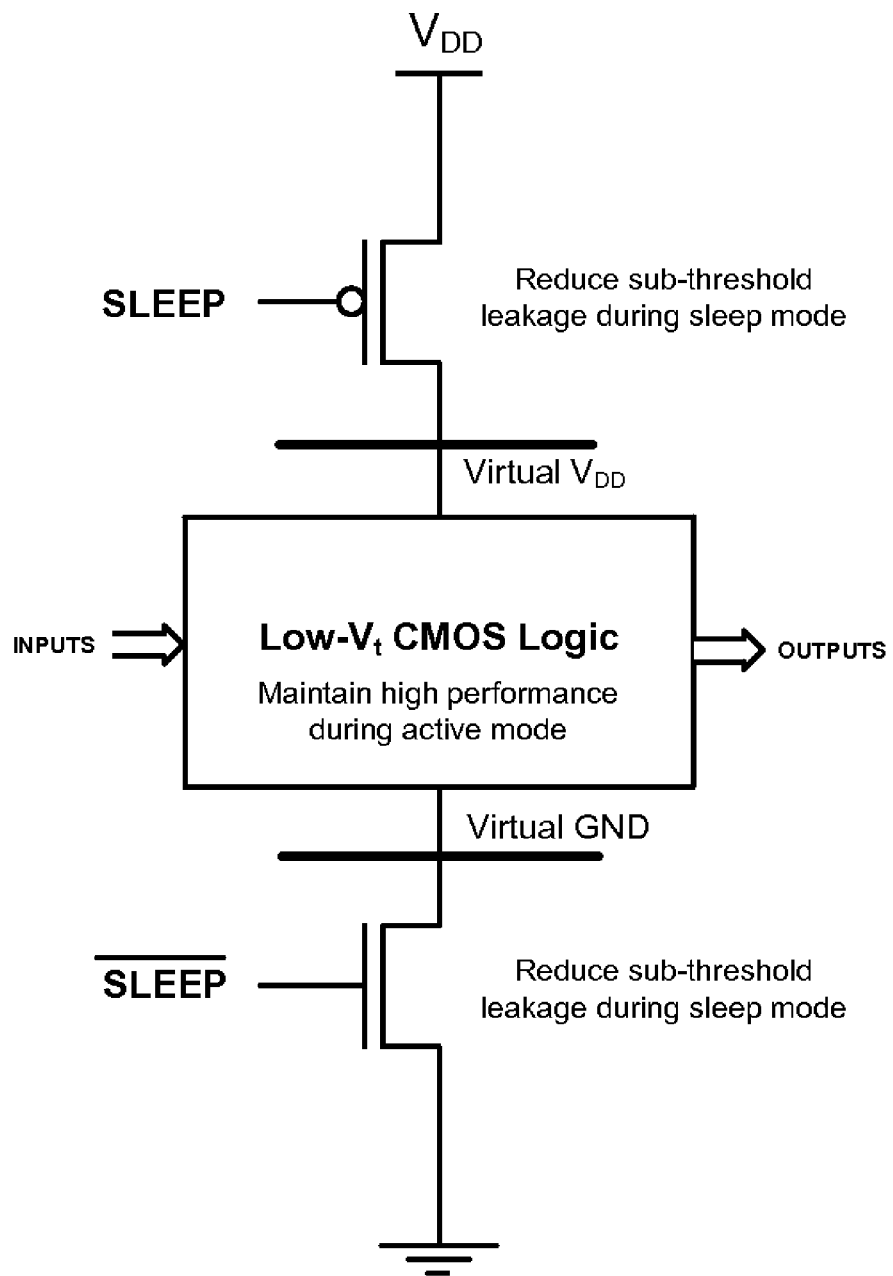
FIG. 1 is a schematic diagram of a prior art MTCMOS circuit architecture.
Figure 2:
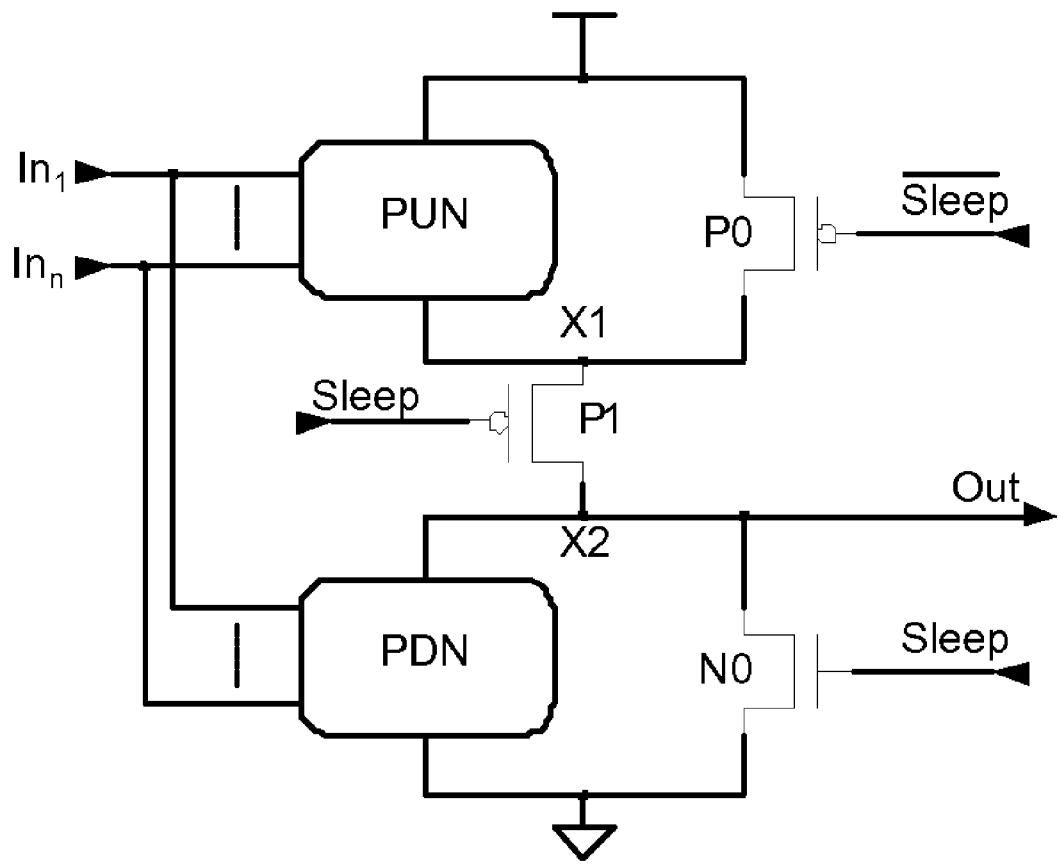
FIG. 2 is a schematic diagram of a prior art MTCMOS circuit as applied to a Boolean gate.

NCL threshold gates are larger and implement more complicated functions than basic Boolean gates, such that fewer threshold gates are normally needed to implement an arbitrary function compared to the number of Boolean gates; however, the NCL implementation often requires more transistors. Therefore, incorporating MTCMOS inside each threshold gate will likely facilitate easy sleep transistor sizing without requiring as large of an area overhead. Since floating nodes may result in substantial short circuit power consumption at the following stage, an MTCMOS structure similar to the one shown in FIG. 2 is used to pull the output node to ground during sleep mode. All of the MTNCL gates in a pipeline stage being in sleep mode (i.e., all gate outputs are logic 0) is equivalent to the pipeline stage being in the NULL state. Hence, after each DATA cycle, all MTNCL gates in a pipeline stage can be forced to output logic 0. By asserting the sleep control signal, instead of propagating a NULL wavefront through the stage, data is not lost during sleep mode.

Since a completion detection signal, Ko, indicates whether the corresponding pipeline stage is ready to undergo a DATA or NULL cycle, Ko can be used as a sleep control signal without requiring any additional hardware. In contrast, complex Sleep signal generation circuitry is needed for synchronous MTCMOS circuits. However, directly implementing this idea, using regular NCL completion, compromises delay-insensitivity.

Figure 3:
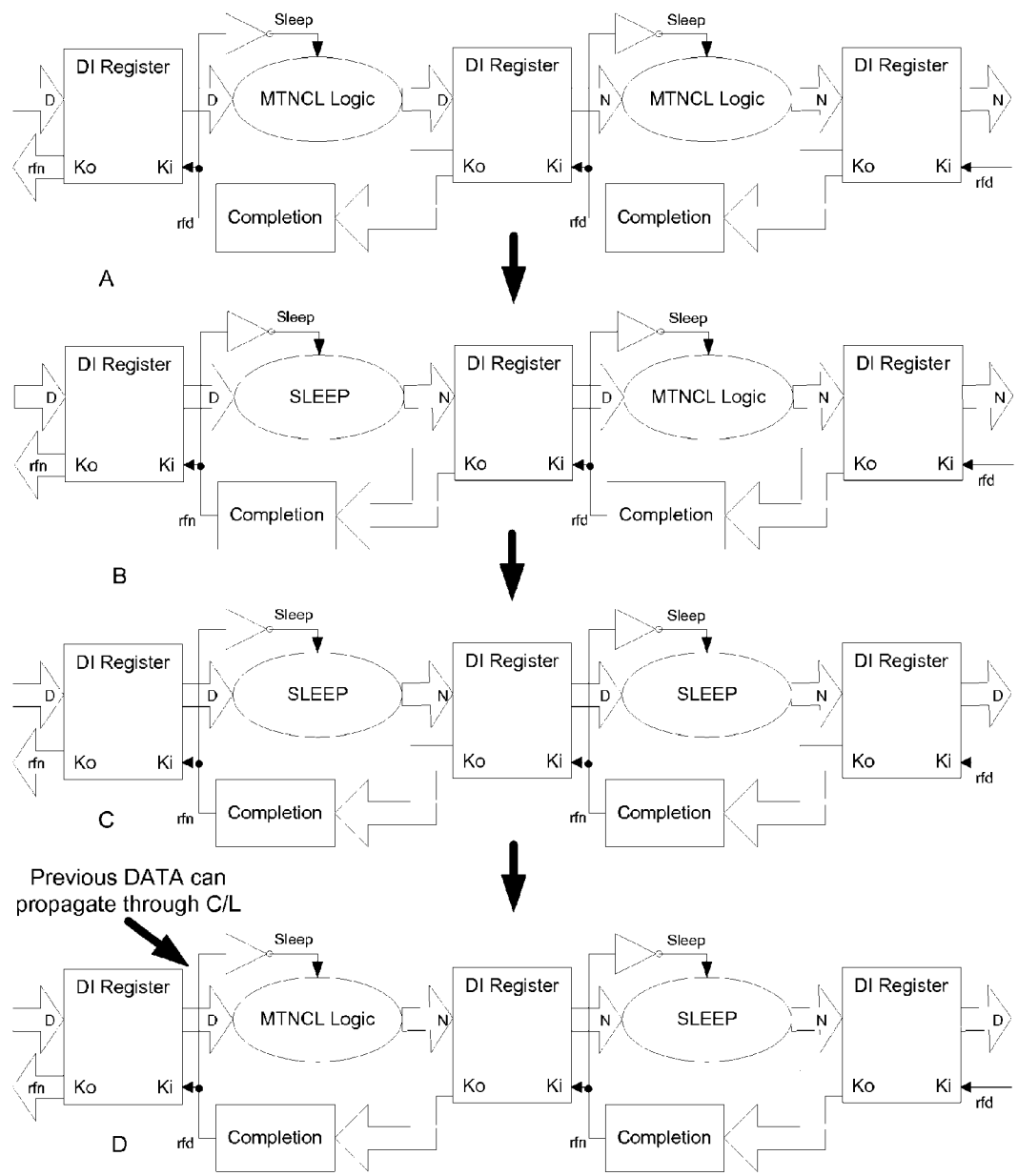
FIGS. 3a-3d are block diagrams of a MTNCL pipeline architecture using regular completion.

Referring to FIG. 3, each inverted completion signal is used as the sleep signal for all MTNCL gates in the corresponding pipeline stage. Looking at the left stage, after a DATA (D) cycle, the completion signal becomes request for null (rfn) (i.e., logic 0), which forces all threshold gates in the stage to enter sleep mode, since the next cycle will be NULL (N). When this sleep generated NULL wavefront is latched by the subsequent register, the stage's completion signal switches back to request for data (rfd) (i.e., logic 1). If this occurs before all bits of the preceding DATA wavefront become NULL, the non-NULL preceding wavefront bits will be retained and utilized in the subsequent operation, thereby compromising delay-insensitivity.

Figure 4:
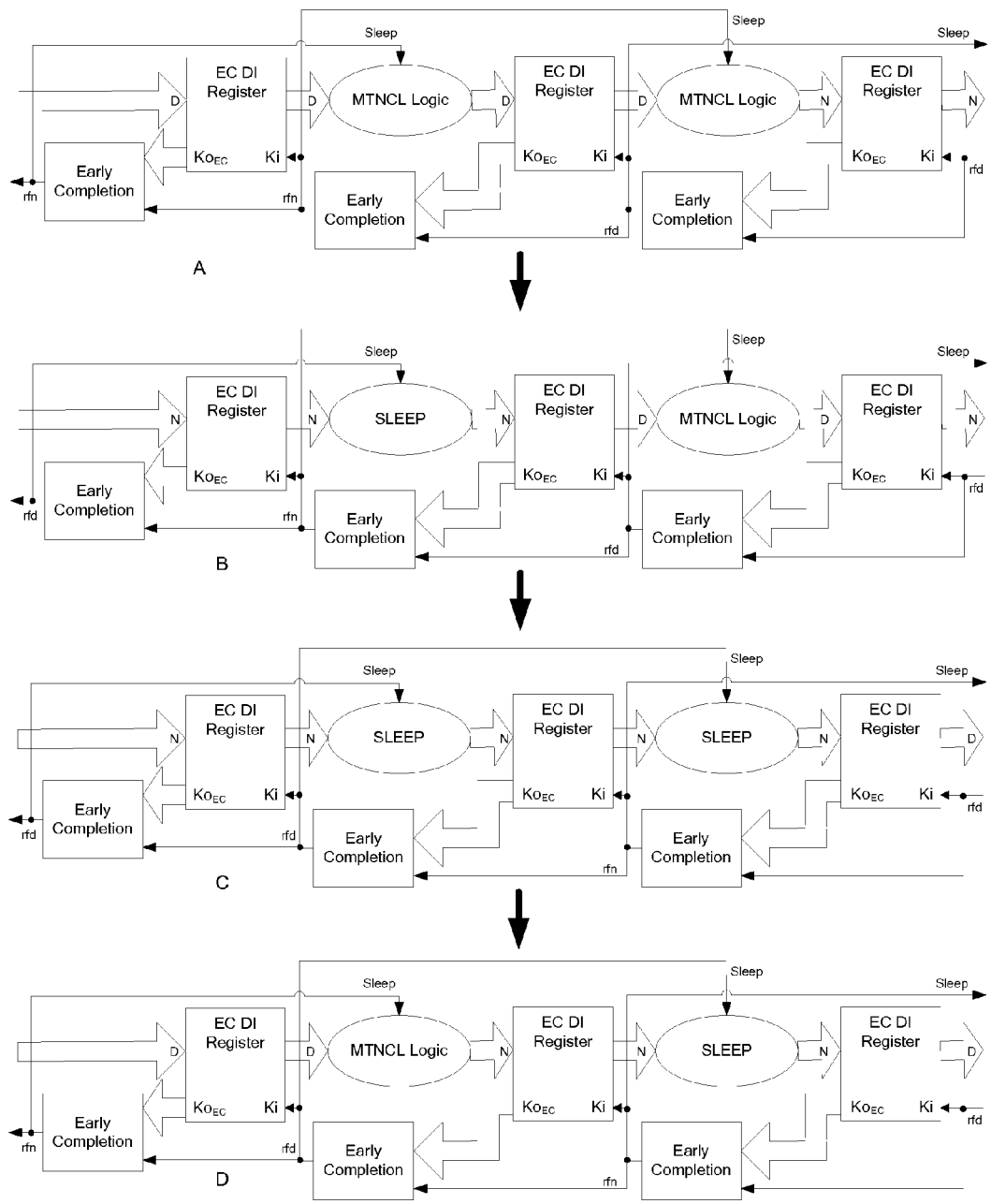
FIGS. 4a-4d are block diagrams of a MTNCL pipeline architecture using early-completion.

Early-completion can be used in lieu of regular completion to solve this problem. With early-completion, the register inputs are used, instead of the outputs, along with the previous stage's completion signal to generate the current stage's completion signal. As shown in FIG. 4, each completion signal is used as the sleep signal for all threshold gates in the subsequent pipeline stage. Now the combinational logic won't be put to sleep until all inputs are NULL and the stage is requesting NULL; therefore the NULL wavefront is ready to propagate through the stage, so the stage can be put to sleep without compromising delay-insensitivity. The stage will then remain in sleep mode until all inputs are DATA, and the stage is requesting DATA (i.e., the stage is ready to evaluate). The early-completion MTNCL architecture ensures input-completeness through the sleep mechanism (i.e., the circuit is only put to sleep after all inputs are NULL, and only evaluates after all inputs are DATA). Using input-incomplete logic functions to design the circuit decreases area and power and increases speed.

MTNCL Threshold Gate Design for ECII Architecture

Figure 5:
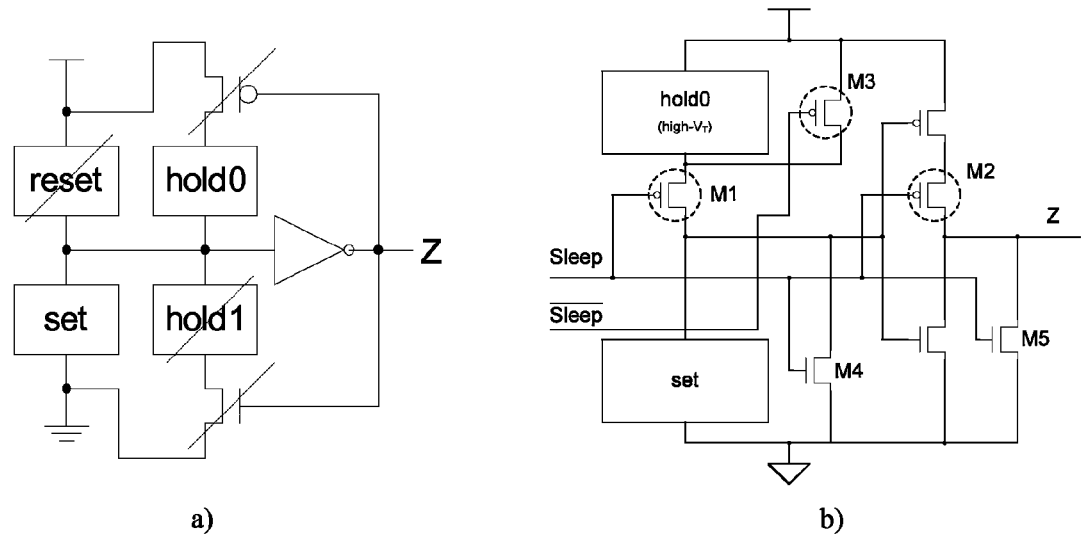
FIGS. 5a and 5b are schematic diagrams of original MTCMOS NCL threshold gates.

Incorporating MTCMOS structure inside each NCL threshold gate, results in a number of the original transistors no longer being needed. For example, as shown in FIG. 5a, the reset circuitry is no longer needed, because the gate output is forced to NULL by the MTCMOS sleep mechanism (instead of all inputs becoming logic 0). Hold1 was used to ensure that the gate remains asserted, once it has become asserted, until all inputs are deasserted. This guarantees input-completeness with respect to the NULL wavefront. However, since the ECII architecture guarantees input-completeness through the sleep mechanism, NCL gate hysteresis is no longer required. Hence, the hold1 circuitry, and corresponding NMOS transistor, are removed. The PMOS transistor is also removed to maintain the complementary nature of CMOS logic (i.e., set and hold0 are complements of each other), such that the gate does not float.

Figure 6:
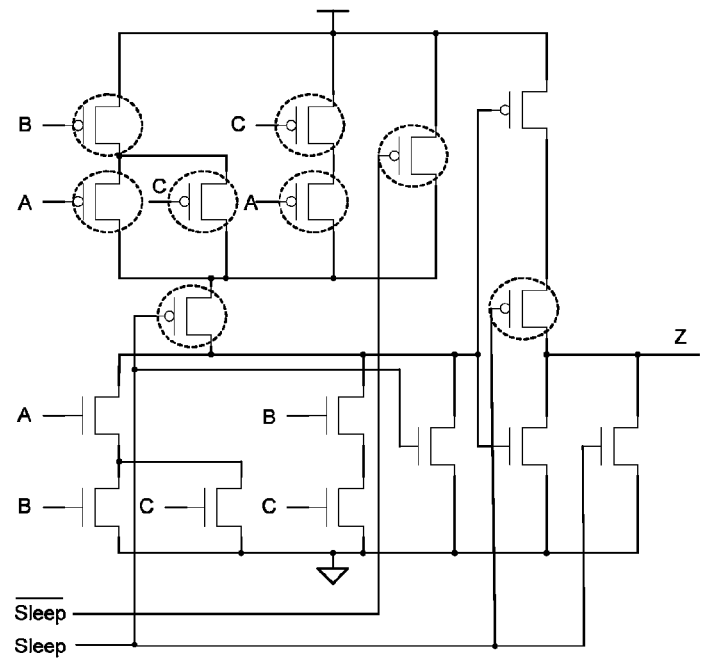
FIG. 6 is a schematic diagram of an original MTCMOS static TH23 gate.
Figure 7:
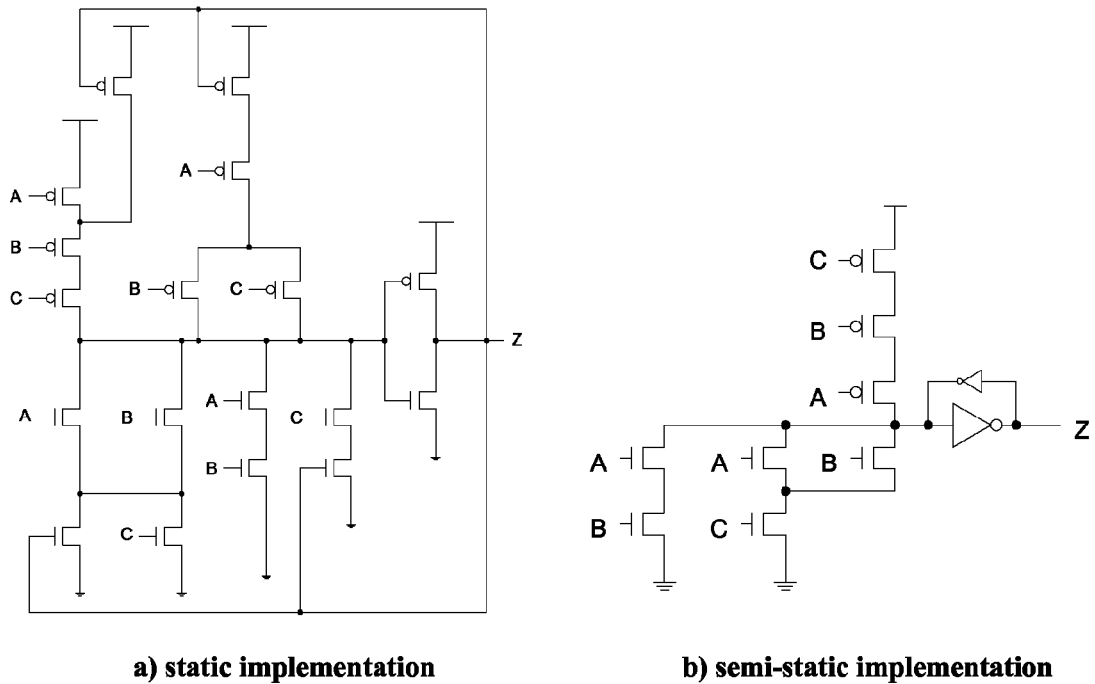
FIG. 7a is a schematic diagram of a static TH23 NCL implementation.
FIG. 7b is a schematic diagram of a semi-static TH23 NCL implementation.

A direct MTCMOS NCL threshold gate implementation, similar to the structure shown in FIG. 2, is shown in FIG. 5b. All PMOS transistors, except the inverter, are high-Vt, (denoted by a dotted circle). This is possible because they are only turned on when the gate enters sleep mode and the inputs become logic 0, and they remain on when the gate exits sleep mode, until the gate's set condition becomes true. In both cases, the gate output is already logic 0; therefore, the speed of these PMOS transistors does not affect performance, and high-Vt transistors are used to reduce leakage current. During active mode, the Sleep signal is logic 0 and $\overline{\text{Sleep}}$ is logic 1, such that sleep transistors M1 and M2 are turned on, and bypass transistors M3 and M4 and the output pull-down transistor M5 are turned off, and the gate functions as normal. During sleep mode, Sleep is logic 1 and $\overline{\text{Sleep}}$ is logic 0, such that M5, which is a low-Vt transistor, is turned on, quickly pulling the output to logic 0, while M3 and M4 are turned on to minimize the voltage potential across the hold0 and set blocks, respectively. The high-Vt gating transistors, M1 and M2, are turned off to reduce leakage. An example of an MTNCL implementation of a static TH23 gate is shown in FIG. 6, whereas an original static TH23 gate is shown in FIG. 7a.

Note that the MTNCL TH23 gate is actually smaller than the original TH23 gate (i.e., 17 vs. 18 transistors). Although the MTNCL structure adds five transistors to each gate, this only increases total number of transistors for 3 of the 27 threshold gates, since the reset and hold1 blocks are removed. This results in the total number of transistors in the MTNCL version normally being less than the original version. Exceptions include the three TH1n gates, which are OR gates, and therefore do not have extra hysteresis circuitry (i.e., reset=hold0 and set=hold1), no transistors are removed for the MTNCL versions. Therefore, these three MTNCL gates require 5 additional transistors each.

Figure 8:
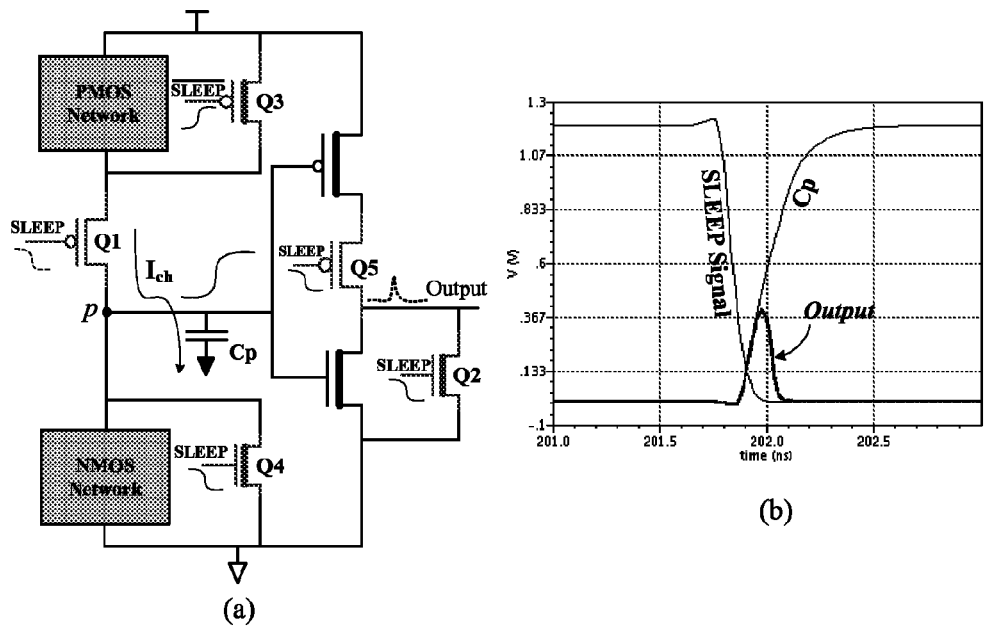

This initial MTNCL static threshold gate structure has been used to implement an 8-bit×8-bit pipelined array multiplier using a 1.2V 130 nm IBM 8RF CMOS process, reducing leakage power 150 times and reducing active energy by 1.8 times compared to a regular NCL low-Vt counterpart. However, as shown in FIG. 8b, this structure produces unwanted glitches at the gate outputs. Referring to FIG. 8a, during sleep mode, Sleep is logic 1 and $\overline{\text{Sleep}}$ is logic 0. Q1 and Q5 are off, while Q1, Q2, and Q4 are on. The internal parasitic capacitance, Cp, is discharged through Q4, making the internal node, p, logic 0. When the gate is taken out of sleep mode, Sleep is logic 0 and $\overline{Sleep}$ is logic 1, Q1 and Q5 are on, and Q2, Q3, and Q4 are off. Since all inputs are logic 0 at this moment, due to the preceding NULL/sleep cycle, Cp begins charging through the PMOS network and Q1. However, before the voltage on p rises to $V_{DD}$-$|V_{TP}|$ (where $V_{TP}$ is the threshold voltage of the PMOS transistor in the output inverter), the gate output (i.e., the input signal to the inverter and the voltage on Cp) starts to rise, momentarily turning on the PMOS transistor, and causing a glitch shown in FIG. 8b. With a supply voltage of 1.2V, these glitches can be as high as 400 mV, and are able to propagate through logic gates. Although a multiplier test circuit still functioned correctly, these glitches need to be removed to ensure reliable operation and eliminate glitch power.

Figure 9:
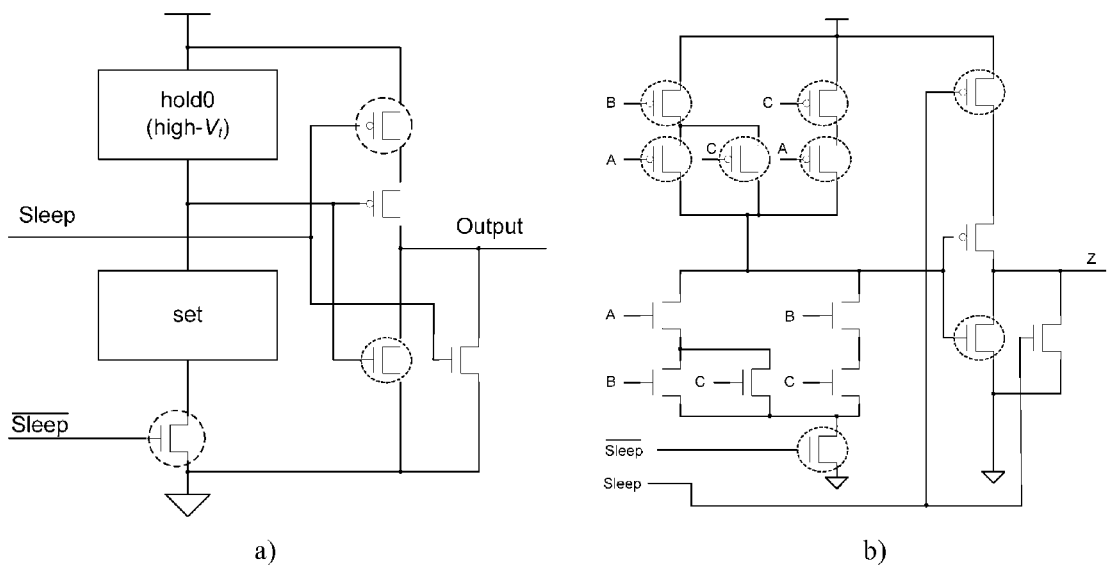
FIG. 9a is a schematic diagram of a SMTNCL gate structure.
FIG. 9b is a schematic diagram of a SMTNCL TH23 implementation.

To reduce or eliminate the glitch, the MTNCL threshold gate structure is modified, as shown in FIG. 9, by moving the power gating high-Vt transistor to the PDN such that during sleep mode the internal node is charged to logic 1. The two bypass transistors, Q3 and Q4, which have only a very minimal contribution to leakage savings can be removed to reduce the area of the gate. Therefore, when the gate is taken out of sleep mode, the output will remain at logic 0 without any glitch, due to the internal logic 1 flowing through the output inverter, until the DATA wavefront arrives. Since the internal node is logic 1 during sleep mode, and the output is logic 0, the NMOS transistor in the output inverter is no longer on the critical path and can be a high-Vt transistor. This modified Static MTNCL threshold gate structure is referred to as SMTNCL.

Delay-Insensitivity Analysis

Figure 10:
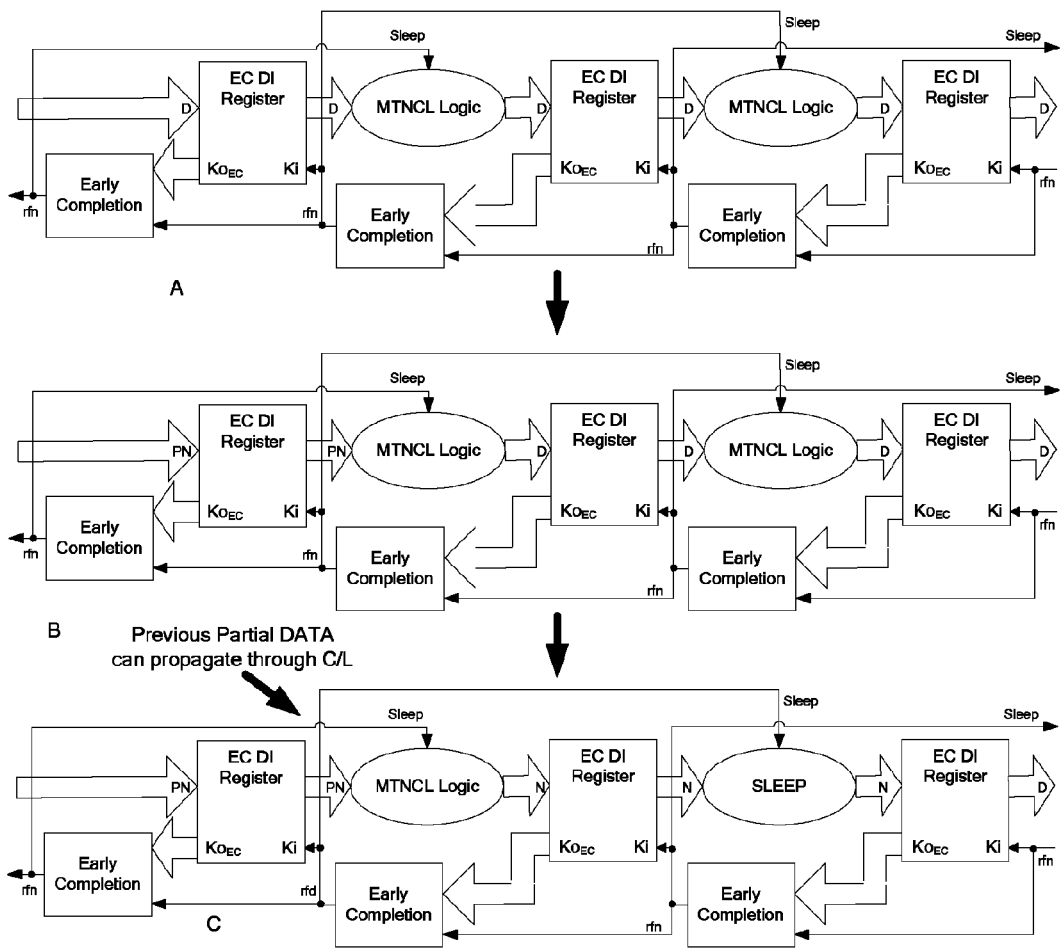
FIGS. 10a-10c are block diagrams of a ECII architecture using SMTNCL gates.

Combining the ECII architecture with the SMTNCL gate structure, results in a delay-sensitivity problem after a DATA cycle, if most, but not all, inputs become NULL (see FIG. 10). Because the subsequent stage is requesting NULL, and because the hold1 logic has been removed from the SMTNCL gates, this Partial NULL (PN) wavefront can pass through the stage's input register causing all stage outputs to become NULL, before all inputs are NULL and the stage is put to sleep. This violates an input-completeness criteria that requires that all outputs of a combinational circuit to not transition from NULL to DATA until all inputs have transitioned from NULL to DATA, and that all outputs of a combinational circuit may not transition from DATA to NULL until all inputs have transitioned from DATA to NULL. This can cause the subsequent stage to request the next DATA while the previous stage input is still a partial NULL, resulting in the preceding wavefront bits that are still DATA being retained and utilized in the subsequent operation. This can compromise delay-insensitivity, similar to the problem encountered using regular completion, as explained above.

Figure 11:
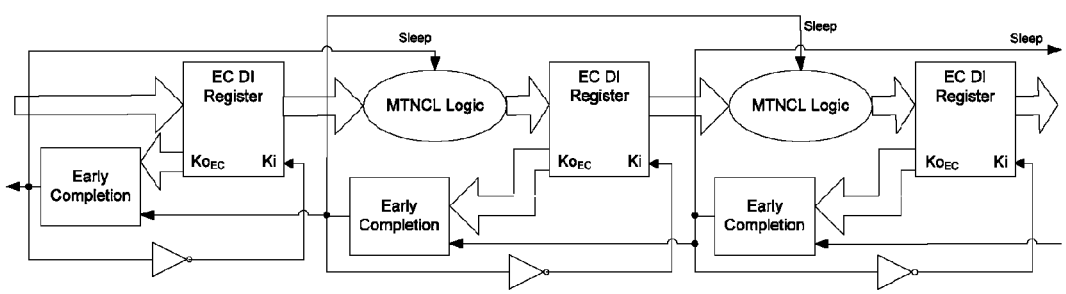
FIG. 11 is a block diagram of a fixed early-completion input-incomplete architecture (FECII).

There are at least two solutions to this problem, one at the architecture level and the other at the gate level. Since the problem is caused by a partial NULL passing through the register, this can be fixed at the architecture-level by ensuring that the NULL wavefront is only allowed to pass through the register after all register inputs are NULL. This is achievable by a Fixed Early-Completion Input-Incomplete (FECII) architecture which uses the stage's inverted sleep signal as its input register's Ki signal. The FECII architecture is shown in FIG. 11. Compared to ECII, FECII is slower because the registers must wait until all inputs become DATA/NULL before they are latched. Note that because the stage will remain in sleep mode until all inputs are DATA, a partial DATA wavefront passing through the register does not pose a problem, and all stage outputs will remain NULL until all inputs are DATA.

Figure 12:
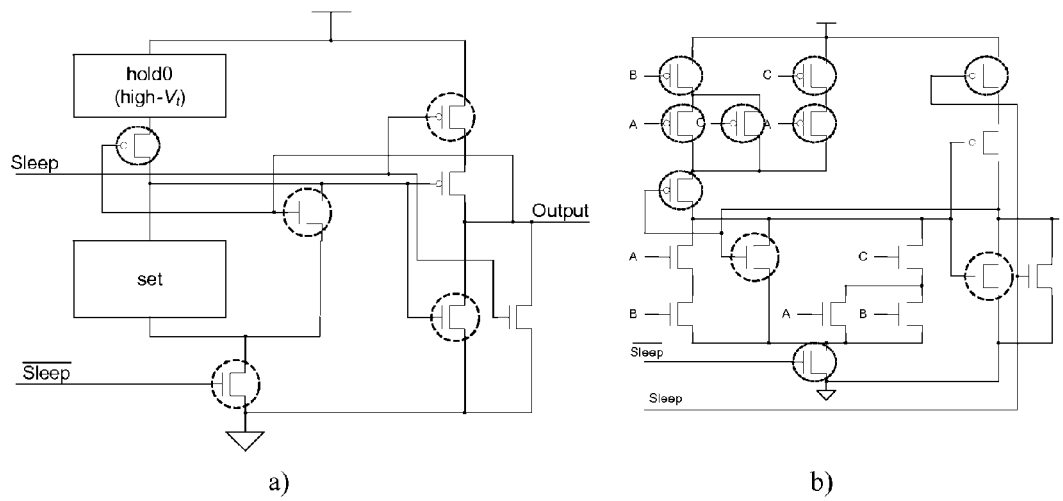
FIG. 12a is a schematic diagram of a SMTNCL1 gate structure.
FIG. 12b is a schematic diagram of a SMTNCL1 TH23 implementation.

This problem can be solved at the gate level using a Static MTNCL implementation with hold1 (SMTNCL1), which requires 2 additional transistors vs. the SMTNCL gate. The feedback NMOS transistor is sufficient to hold the output at logic 1, without requiring the traditional NCL hold1 circuitry, because this ensures that once the gate output has been asserted due to the current DATA wavefront, that it will only be deasserted when the gate is put to sleep (i.e., when all circuit inputs are NULL), and will not be deasserted due to a partial NULL wavefront. The SMTNCL1 design is shown in FIG. 12.

Figure 13:
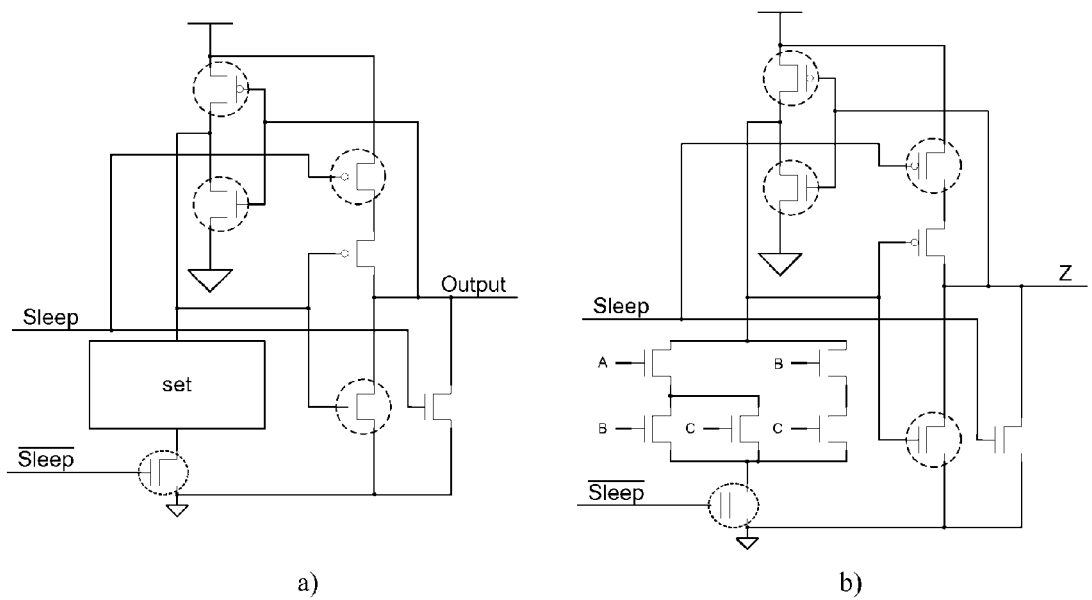
FIG. 13a is a schematic diagram of a SSMTNCL1 gate structure.
FIG. 13b is a schematic diagram of a SSMTNCL1 TH23 implementation.
Figure 14:
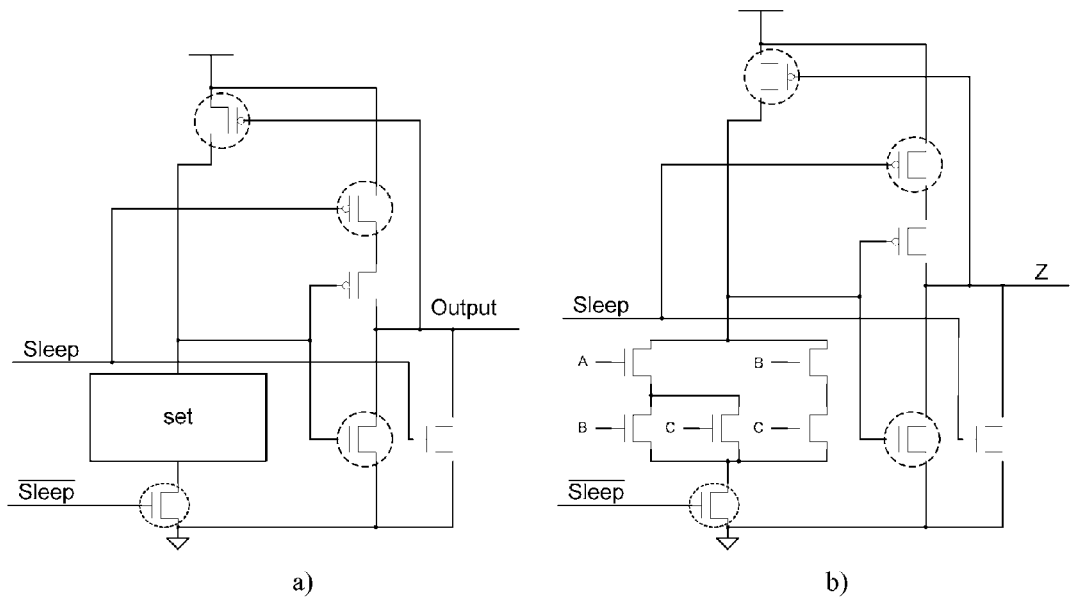
FIG. 14a is a schematic diagram of a SSMTNCL gate structure.
FIG. 14b is a schematic diagram of a SSMTNCL TH23 implementation.

The MTCMOS structure can also be applied to semi-static NCL gates, which utilize a weak feedback inverter to implement the hold1 and hold0 functions. This Semi-Static MTNCL design with hold1 (SSMTNCL1), is shown in FIG. 13. Note that a 1 (one) at the end of an MTNCL gate name denotes that the gate includes hold1 circuitry. The NMOS transistor in the weak inverter that serves as the hold1 function is not needed for the FECII architecture; and can be removed to save area. This results in a modified Semi-Static MTNCL design (SSMTNCL) shown in FIG. 14.

To summarize, the ECII architecture works with SMTNCL1 or SSMTNCL1 gates, which include the hold1 function. The FECII architecture works with all four MTNCL gate designs (i.e., SMTNCL, SMTNCL1, SSMTNCL1, and SSMTNCL). However, the SMTNCL and SSMTNCL gates require fewer transistors than their equivalent SMTNCL1 and SSMTNCL1 gates, such that the FECII architecture would normally use either the SMTNCL or SSMTNCL gates. Additionally, the ECII architecture is faster than FECII; and the static NCL gates (i.e., SMTNCL and SMTNCL1) perform better than their semi-static counterparts (i.e., SSMTNCL and SSMTNCL1) at reduced supply voltages. This is because the static implementations do not utilize a weak inverter, which ceases to operate properly with a substantially reduced supply voltage, for state-holding.

Figure 15:
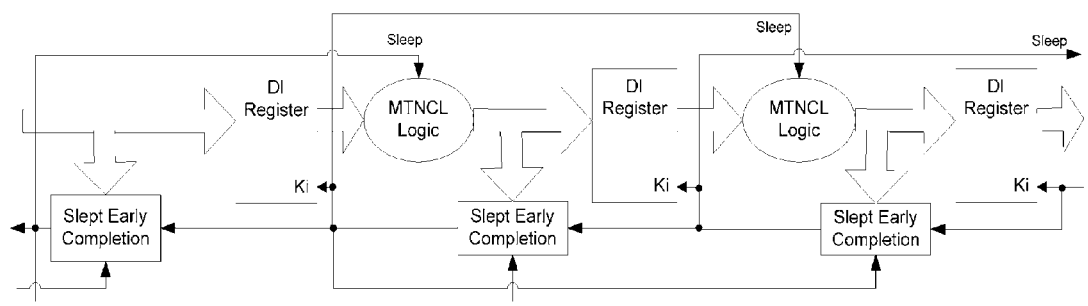
FIG. 15 is a block diagram of a Slept Early Completion Input-Incomplete (SECII) architecture.
Figure 16:
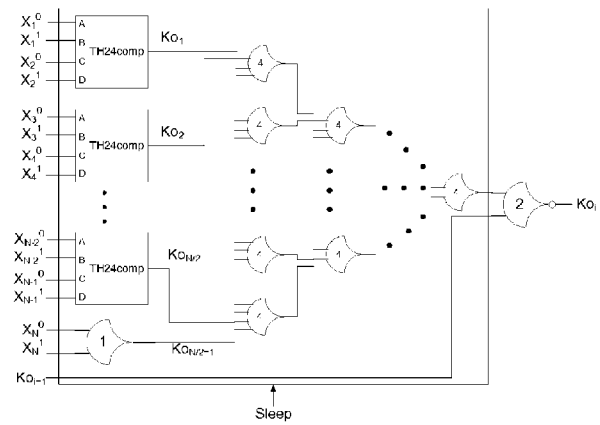
FIG. 16 is a schematic diagram of an Early completion component with Sleep input.

In the MTNCL architectures described so far, an NCL circuit's C/L was slept in lieu of the NULL cycle to significantly reduce leakage power. However, during sleep mode the circuit's completion and registration logic remains active, which for a fine grain pipelined circuit may be a significant portion of the logic. Therefore, it would be very beneficial to be able to sleep the completion and registration logic in addition to the C/L. The completion logic can be slept by modifying the ECII architecture, shown in FIG. 4, to include a sleep input to the completion logic and use SMTNCL1 gates to implement the completion logic, as shown in FIGS. 15 and 16, respectively. Note that the final inverting TH22 gate is a regular NCL gate, which is not slept. This is consistent with the NULL cycle, where the internal completion component gates are all logic 0, except for the final inverting TH22 gate.

Figure 17:
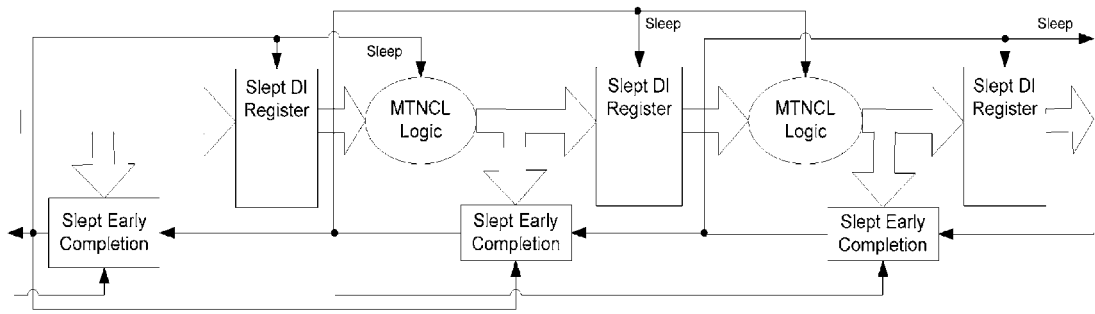
FIG. 17 is a block diagram of a Slept Early Completion and Registration Input-Incomplete (SECRII) architecture.
Figure 18:
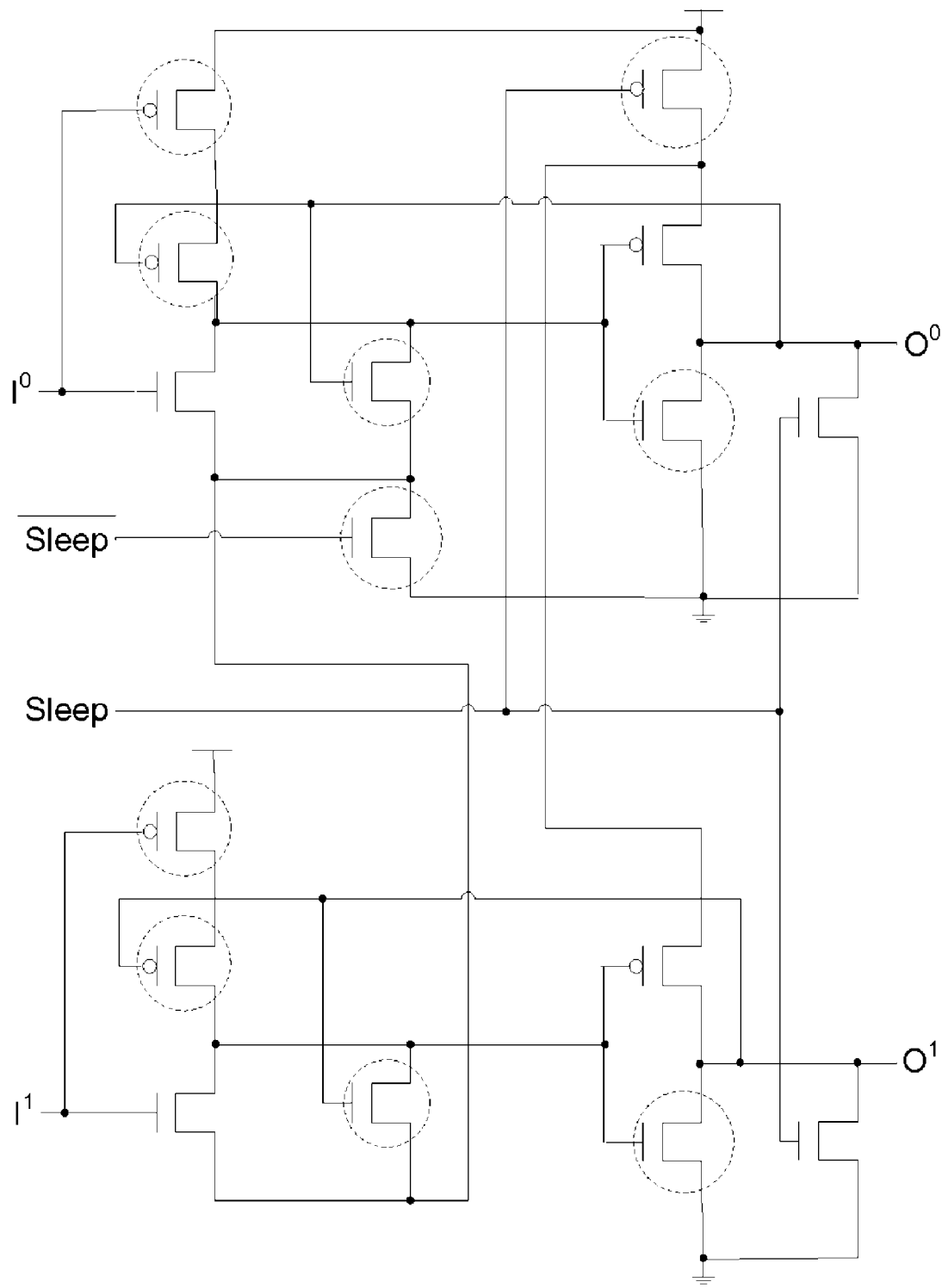
FIG. 18 is a schematic diagram of a DI register with Sleep input.

During a NULL cycle, the register output is also NULL, so it too can be slept, as shown in FIG. 17. Instead of using two SMTNCL1 TH22 gates to implement the register, the sleep transistors for each rail can be combined, such that a dual-rail register is implemented as a single component in order to reduce area, as shown in FIG. 18. Note that this architecture is similar to the FECII architecture shown in FIG. 11, which does not allow a partial NULL to propagate through the register, such that the C/L can be implemented with the smaller SMTNCL gates instead of SMTNCL1 gates.

Table I compares the various MTNCL architectures and original NCL circuits using a 4-stage pipelined IEEE single-precision floating-point co-processor, which performs addition, subtraction, and multiplication.

TABLE I

MTNCL comparisons.

| | # Transistors | $T_{DD}$ (ns) | Energy/ Operation (pJ) | Leakage Power (nW) |
|---|---|---|---|---|
| NCL Low-$V_t$ | 158059 | 14.1 | 25.6 | 13300 |
| NCL High-$V_t$ | 158059 | 32.5 | 25.9 | 300 |
| SMTCNL with FECII | 111506 | 13.4 | 20.7 | 377 |
| SMTNCL1 with ECII | 119706 | 14.3 | 20.6 | 382 |
| SMTNCL1 with SECII | 119244 | 12.8 | 20.5 | 382 |
| SMTNCL with SECRII | 96640 | 12.6 | 19.5 | 346 |

Some concepts of early completion circuits are described in S. C. Smith, "*Speedup of Self-Timed Digital Systems Using Early Completion*," The IEEE Computer Society Annual Symposium on VLSI, pp. 107-113, April 2002, the contents of which are hereby incorporated by reference.

What is claimed is:

1. An early completion input incomplete asynchronous circuit (ECII), the ECII comprising:
    a delay insensitive register having a data input, a data output, a request input, and an acknowledge output;
    a multi-threshold null convention logic circuit having a data input coupled to the delay insensitive register data output, a sleep input, and an output coupled to a data input of a delay insensitive register of a subsequent ECII; and
    an early completion circuit having a first input coupled to the acknowledge output, a second input coupled to the request input, and an output coupled to the sleep input and to a request input of a delay insensitive register of a previous ECII.

2. The circuit of claim 1, wherein the acknowledge output includes a plurality of acknowledge signals.

3. The circuit of claim 1, wherein the early completion circuit outputs a request for data when the first input is a null and the second input is a request for null.

4. The circuit of claim 1, wherein the early completion circuit outputs a request for null when the first input is a data and the second input is a request for data.

5. The circuit of claim 1, wherein the early completion circuit maintains its output until the first and second inputs are null/request for null or data/request for data.

6. The circuit of claim 1, wherein the multi-threshold null convention logic circuit is one of a static multi-threshold null convention logic with hold1 circuit and a semi-static multi-threshold null convention logic with hold1 circuit.

7. A fixed early completion input incomplete asynchronous circuit (FECII), the FECII comprising:
    a delay insensitive register having a data input, a data output, a request input, and an acknowledge output;
    a multi-threshold null convention logic circuit having a data input coupled to the delay insensitive register data output, a sleep input, and an output coupled to a data input of a delay insensitive register of a subsequent FECII;
    an early completion circuit having a first input coupled to the acknowledge output, a second input coupled to an output of an early completion circuit of a subsequent FECII, and an output coupled to the sleep input and to an input of an early completion circuit of a previous FECII; and
    an inverter coupled to the output of the early completion circuit and having an output coupled to the request input.

8. The circuit of claim 7, wherein the first acknowledge output, the second acknowledge output, and the third acknowledge output each include a plurality of acknowledge signals.

9. The circuit of claim 7, wherein the early completion circuit outputs a request for data when the first input is a null and the second input is a request for null.

10. The circuit of claim 7, wherein the early completion circuit outputs a request for null when the first input is a data and the second input is a request for data.

11. The circuit of claim 7, wherein the early completion circuit maintains its output until the first and second inputs are null/request for null or data/request for data.

12. The circuit of claim 7, wherein each of the multi-threshold null convention logic circuit is one of a static multi-threshold null convention logic with hold1 circuit, a semi-static multi-threshold null convention logic with hold1 circuit, a static multi-threshold null convention logic circuit, and a semi-static multi-threshold null convention logic circuit.

13. An early completion input incomplete asynchronous circuit (ECII), the circuit comprising:
    a delay insensitive register having a data input and a data output;
    a multi-threshold null convention logic circuit having a data input coupled to the delay insensitive register data output, a sleep input, and a data output; and
    a slept early completion circuit having a first input coupled to an output of an early completion circuit of a subsequent ECII, a second input coupled to the output of an early completion circuit of a previous ECII, a third input coupled to the delay insensitive register data input, and an output coupled to the sleep input.

14. The circuit of claim 13, wherein the delay insensitive register includes a request input coupled to the slept early completion circuit first input.

15. The circuit of claim 13, wherein the delay insensitive register is a slept delay insensitive register and includes a sleep input coupled to the slept early completion circuit output.

16. The circuit of claim 13, wherein the slept early completion circuit outputs a request for data when the first input is a request for data and the second input is a request for null.

17. The circuit of claim 13, wherein the early completion circuit outputs a request for null when the first input is a request for null, the second input is a request for data, and the third input is a data.

18. The circuit of claim 13, wherein the early completion circuit maintains its output as a request for null until the first input is a request for data and the second input is a request for null.

19. The circuit of claim 13, wherein the early completion circuit maintains its output as a request for data until the first input is a request for null, the second input is a request for data, and the third input is a data.

20. The circuit of claim 13, wherein each of the multi-threshold null convention logic circuit is one of a static multi-threshold null convention logic with hold1 circuit, a semi-static multi-threshold null convention logic with hold1 circuit, a static multi-threshold null convention logic circuit, and semi-static multi-threshold null convention logic circuit.

* * * * *